(12) United States Patent
Jin et al.

(10) Patent No.: US 9,508,760 B2
(45) Date of Patent: Nov. 29, 2016

(54) METHOD FOR MAKING THIN FILM TRANSISTOR ARRAY

(71) Applicants: Tsinghua University, Beijing (CN); HON HAI PRECISION INDUSTRY CO., LTD., New Taipei (TW)

(72) Inventors: Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/621,384

(22) Filed: Feb. 13, 2015

(65) Prior Publication Data
US 2015/0243690 A1    Aug. 27, 2015

(30) Foreign Application Priority Data

Feb. 24, 2014  (CN) .......................... 2014 1 0061345

(51) Int. Cl.
*H01L 27/12*    (2006.01)
*H01L 21/02*    (2006.01)

(52) U.S. Cl.
CPC ..... *H01L 27/1262* (2013.01); *H01L 21/02554* (2013.01); *H01L 21/02565* (2013.01); *H01L 21/02568* (2013.01); *H01L 21/02601* (2013.01); *H01L 27/1292* (2013.01); *H01L 21/02628* (2013.01)

(58) Field of Classification Search
CPC ...... H01L 27/12; H01L 21/465; H01L 21/02

USPC ................................ 438/158, 23, 99, 27, 28
See application file for complete search history.

(56) References Cited

U.S. PATENT DOCUMENTS

| 6,126,740 | A | 10/2000 | Schulz et al. |
| 2009/0283744 | A1 | 11/2009 | Jiang et al. |
| 2010/0244029 | A1 | 9/2010 | Yamazaki et al. |
| 2010/0252176 | A1 | 10/2010 | Tokie et al. |
| 2011/0037124 | A1 | 2/2011 | Liu et al. |
| 2011/0215315 | A1* | 9/2011 | Toguchi ................. B82Y 10/00 257/40 |
| 2012/0058598 | A1 | 3/2012 | Yamazaki |
| 2013/0056738 | A1 | 3/2013 | Ikeda et al. |
| 2014/0306191 | A1* | 10/2014 | Lee ..................... H01L 27/3225 257/40 |

FOREIGN PATENT DOCUMENTS

| JP | 2005-223033 | 8/2005 |
| JP | 2009-278113 | 11/2009 |
| JP | 2010-532096 | 9/2010 |
| TW | 201110354 | 3/2011 |

(Continued)

*Primary Examiner* — Chuong A Luu
*Assistant Examiner* — Rodolfo Fortich
(74) *Attorney, Agent, or Firm* — Zhigang Ma

(57) ABSTRACT

A method for making thin film transistor array includes following steps. A gate electrode is formed on a surface of the insulating substrate. An insulating layer is deposited on the insulating substrate to cover the gate electrode. A carbon nanotube layer is applied on the insulating layer. A number of source electrodes and a number of drain electrodes opposite with each other is formed by patterning the carbon nanotube layer. A semiconductor layer is formed by coating a semiconductor fragments suspension on the insulating layer, wherein the semiconductor layer comprises a number of semiconductor fragments located between the number of source electrodes and the number of drain electrodes.

16 Claims, 10 Drawing Sheets

(56) References Cited

FOREIGN PATENT DOCUMENTS

| TW | 201227964 | 7/2012 |
| TW | 201347197 | 11/2013 |
| TW | 201349331 | 12/2013 |
| WO | WO9937832 | 7/1999 |
| WO | WO2011122205 | 10/2011 |

* cited by examiner

METHOD FOR MAKING THIN FILM TRANSISTOR ARRAY

This application claims all benefits accruing under 35 U.S.C. §119 from China Patent Application No. 201410061345.8, filed on Feb. 24, 2014 in the China Intellectual Property Office.

BACKGROUND

1. Technical Field

The present invention relates to a method of making thin film transistor array.

2. Description of Related Art

A typical thin film transistor (TFT) is made of a substrate, a gate electrode, an insulation layer, a drain electrode, a source electrode, and a semiconducting layer.

The thin film transistor performs a switching operation by modulating an amount of carriers accumulated in an interface between the insulation layer and the semiconductor layer from an accumulated state to a depletion state, with applied voltage to the gate electrode, to change an amount of the current passing between the drain electrode and the source electrode. However, at present, the semiconductor material such as metal sulfides or transition metal oxide in the semiconductor layer comprises more than hundreds of layers, thus the thickness is high, and the semiconductor material is hard to form a conductive network between the drain electrode and the source electrode. Thus the semiconductor layer cannot be suitable for large-scaled thin film transistor.

What is needed, therefore, is a method of making TFT array that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
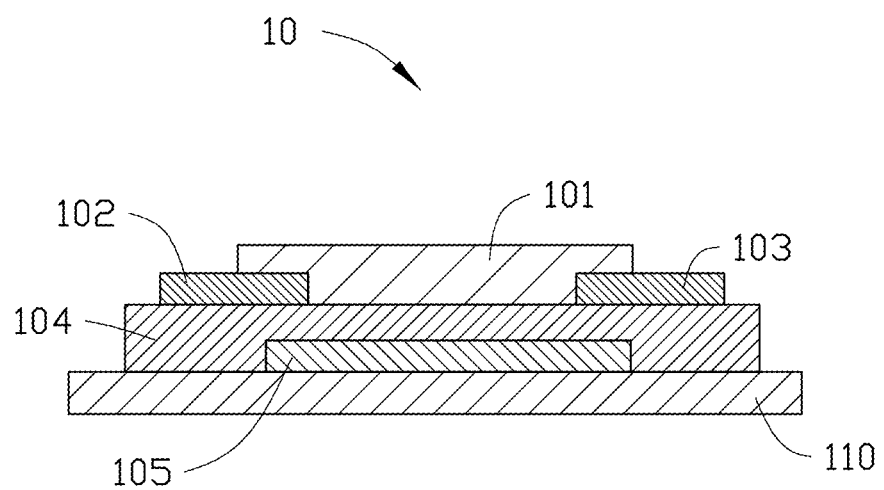
FIG. 1 is a cross sectional view of one embodiment of a thin film transistor.

Referring to FIG. 1, a thin film transistor 10 of one embodiment comprises a semiconductor layer 101, a source electrode 102, a drain electrode 103, an insulating layer 104, and a gate electrode 105. The thin film transistor 10 is located on a surface of the insulating substrate 110. The source electrode 102 and the drain electrode 103 are spaced from each other and electrically connected to the semiconductor layer 101. The gate electrode 105 is insulated from the semiconductor layer 101, the source electrode 102, and the drain electrode 103 because of the insulating layer 104.

The thin film transistor 10 can be a bottom gate structure. The gate electrode 105 is located on the insulating substrate 110, and the insulating layer 104 covers the gate electrode 105. The semiconductor layer 101 is located on the insulating layer 104, and insulated from the gate electrode 105 through the insulating layer 104. The source electrode 102 and the drain electrode 103 are spaced apart from each other and electrically connected to the semiconductor layer 101. A channel 106 is formed in the semiconductor layer 101 at a region between the source electrode 102 and drain electrode 103. The channel 106 is a portion of the semiconductor layer 101.

Figure 2:
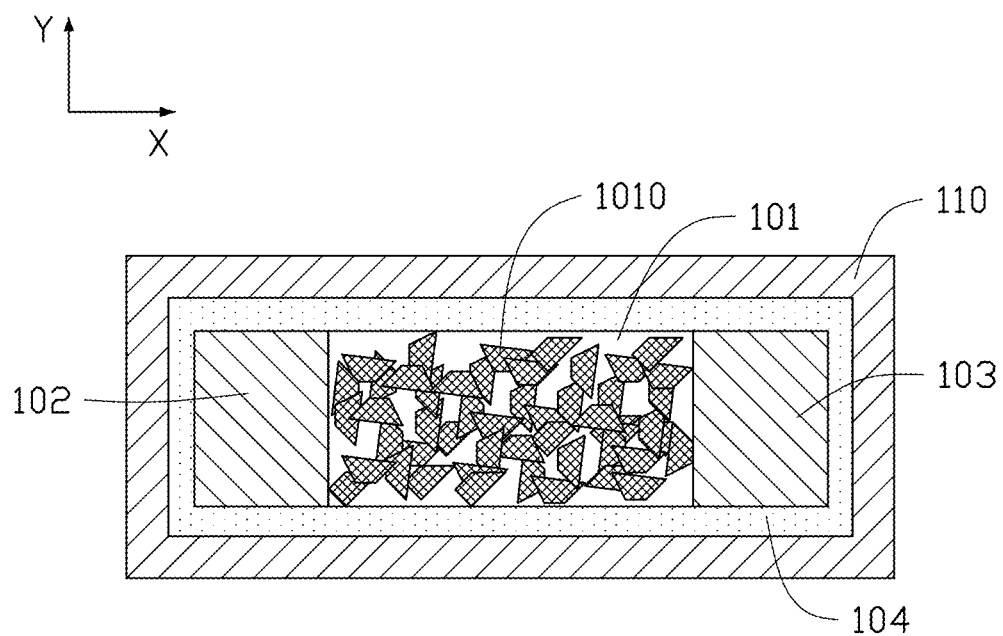
FIG. 2 is a schematic top view of the thin film transistor of FIG. 1.
Figure 3:
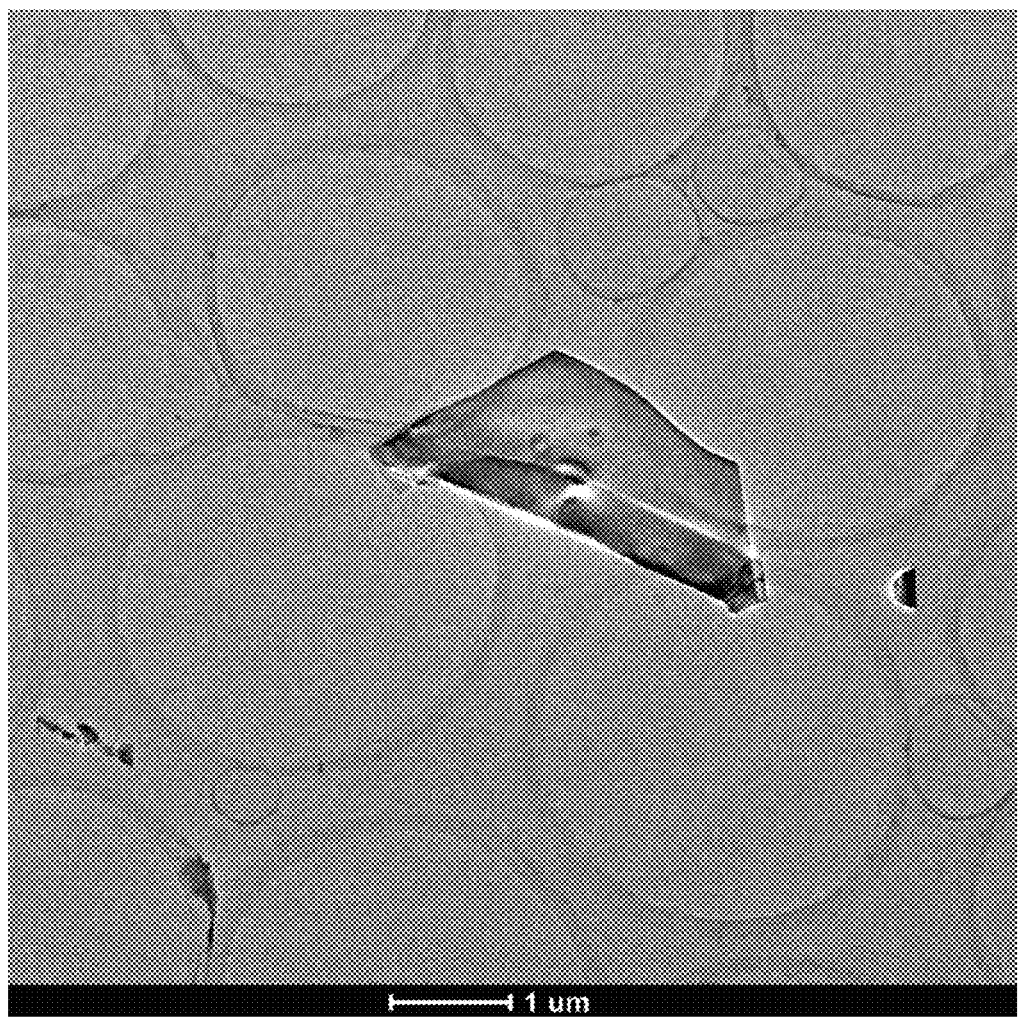
FIG. 3 shows a Transmission Electron Microscope (TEM) image of semiconductor fragments in the thin film transistor of FIG. 1.

Referring to FIG. 2 and FIG. 3, the semiconductor layer 101 comprises a plurality of semiconductor fragments 1010. The plurality of semiconductor fragments 1010 are connected with each other to form the channel 106. The plurality of semiconductor fragments 1010 form a conductive network to let carriers flow between the source electrode 102 sand the drain electrode 103. Furthermore, some of the plurality of semiconductor fragments 1010 can be partially overlapped with each other and be connected with each other to form a plurality of conductive networks.

A contact area between the adjacent two semiconductor fragments 1010 can be smaller than a half area of each of the plurality of semiconductor fragments 1010. Referring to FIG. 2, the plurality of semiconductor fragments 1010 are partially overlapped with each other and aligned along a plurality of straight lines or a plurality of curve lines. The plurality of semiconductor fragments 1010 can cover a portion of the insulating substrate 110 and form a plurality of conductive path. A first area of the insulating substrate 110 covered by the plurality of semiconductor fragments 1010 can be defined as A, a second area of the insulating substrate 110 between the source electrode 102 and the drain electrode 103 is defined as B. Thus a percentage between the first area A and the second area B ranges from about 2% to about 80%. In one embodiment, the percentage of ranges from about 10% to about 80%.

Because merely the first area A of the insulating substrate 110 is covered by the plurality of semiconductor fragments 1010, the transparent of the thin film transistor 10 can be improved compared to the traditional thin film transistor. In the traditional film transistor, the area between the source electrode and the drain electrode are completely covered by the semiconductor layer. Furthermore, the amount of the semiconductor layer can be dramatically decreased, and cost can be lowered. The plurality of semiconductor fragments 1010 can also cover the entire exposed surface between the source electrode 102 and the drain electrode 103.

A material of each of the plurality of semiconductor fragments 1010 can be transition metal sulfides, transition metal oxides, or non-metal nitrides. The material of the semiconductor fragment 1010 can be $MoS_2$, $WS_2$, BN, MnO$_2$, ZnO, MoSe$_2$, MoTe$_2$, TaSe$_2$, NiTe$_2$, or Bi$_2$Te$_3$. A shape of each of the plurality of semiconductor fragments 1010 can be rectangular, triangular, polygonal, or irregular shape. Each of the plurality of semiconductor fragments 1010 is a sheet film and has an area ranges from about 3 square micrometers to about 4 square micrometers. A thickness of each of the plurality of semiconductor fragments 1010 ranges from about 2 nanometers to about 20 nanometers. In one embodiment, the thickness ranges from about 2 nanometers to about 10 nanometers.

The plurality of semiconductor fragments 1010 are derived and stripped from the layered semiconductor material with hundreds of layers. The plurality of semiconductor fragments 1010 have quite small thickness and huge size relatively. A ratio between the area and the thickness of each of the plurality of semiconductor fragments 1010 ranges from about 3×10$^5$ nanometer to about 4×10$^5$ nanometer. Each of the plurality of semiconductor fragments 1010 is a layered structure with a plurality of semiconductor molecular layers. Each of the plurality of semiconductor molecular layers has a thickness of single molecule. Each of the plurality of semiconductor fragments 1010 has several semiconductor molecular layers smaller than 100 layers. In one embodiment, each of the plurality of semiconductor fragments 1010 has a number of layers ranging from about 1 layer to about 10 layers. Because of each of the plurality of semiconductor fragments 1010 have few layers smaller than 100, the semiconductor layer 101 can be effectively modulated by the gate electrode 105, and the sensitivity of the thin film transistor 10 can be improved.

Furthermore, the thickness of the plurality of semiconductor fragments 1010 is nano-scaled, thus the thickness of the semiconductor layer 101 is nano-scaled. The plurality of semiconductor fragments 1010 can uniformly distributed on the insulating layer 104.

The plurality of semiconductor fragments 1010 are parallel with the surface of the semiconductor layer 101 and the insulating layer 104. Two opposite ends of the plurality of semiconductor fragments 1010 are electrically connected to the source electrode 102 and the drain electrode 103. A first direction X is defined as a direction from the source electrode 102 toward the drain electrode 103. A second direction Y is defined as a direction perpendicular to the first direction X parallel with the surface of the insulating layer 104. Thus while the plurality of semiconductor fragments 1010 are joined end to end and aligned along the first direction X, each of plurality of semiconductor fragments 1010 has a length l along the first direction X. The channel 106 has a width d along the first direction X. Thus a quantity of the plurality of semiconductor fragments 1010 can be determined by the length l and the width d. In one embodiment, the quantity is greater than d/l. Thus the quantity can be controllable. In one embodiment, the width d is smaller than 2 micrometers, thus single semiconductor fragment 1010 can be located between the source electrode 102 and the drain electrode 103 to form the conductive path. Thus it is easy to design and fabricate an electronic device with a number of thin film transistors 10. The width d of channel 106 can range from about 10 micrometers to about 100 micrometers.

The material of the thin film transistor can be selected according to the type of the thin film transistor 10. In one embodiment, while the semiconductor material is MoS$_2$ membrane fragments or other N-type semiconductor material, the thin film transistor 10 is N-type transistor. In another embodiment, the semiconductor material is P-type semiconductor material such as WS$_2$, the thin film transistor 10 is a P-type transistor.

In one embodiment, the material of the semiconductor fragment 1010 is MoS$_2$ and in a shape of rectangle. Each of the plurality of semiconductor fragments 1010 has a size of 4 square micrometers. Each of the plurality of semiconductor fragments 1010 has a thickness of 7 nanometers and 10 layers semiconductor molecular layers.

The material of the source electrode 102 and the drain electrode 103 can a carbon nanotube layer. The carbon nanotube layer comprises a plurality of carbon nanotubes. The carbon nanotubes of the carbon nanotube layer can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be substantially the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the carbon nanotube layer are arranged to extend along the direction substantially parallel to the surface of the carbon nanotube layer. In one embodiment, all the carbon nanotubes in the carbon nanotube layer are arranged to extend along the same direction. In another embodiment, some of the carbon nanotubes in the carbon nanotube layer are arranged to extend along a first direction, and some of the carbon nanotubes in the carbon nanotube layer are arranged to extend along a second direction, perpendicular to the first direction.

In one embodiment, the carbon nanotube layer is a free-standing structure and can be drawn from a carbon nanotube array. The term "free-standing structure" means that the carbon nanotube layer can sustain the weight of itself when it is hoisted by a portion thereof without any significant damage to its structural integrity. Thus, the carbon nanotube layer can be suspended by two spaced supports. The free-standing carbon nanotube layer can be laid on the insulating layer 104 directly and easily.

The carbon nanotube layer can be a substantially pure structure of the carbon nanotubes, with few impurities and chemical functional groups. The carbon nanotube layer can be a composite including a carbon nanotube matrix and non-carbon nanotube materials. The non-carbon nanotube materials can be graphite, graphene, silicon carbide, boron nitride, silicon nitride, silicon dioxide, diamond, amorphous carbon, metal carbides, metal oxides, or metal nitrides. The non-carbon nanotube materials can be coated on the carbon nanotubes of the carbon nanotube layer or filled in the apertures. In one embodiment, the non-carbon nanotube materials are coated on the carbon nanotubes of the carbon nanotube layer so the carbon nanotubes can have a greater diameter and the apertures can a have smaller size. The non-carbon nanotube materials can be deposited on the carbon nanotubes of the carbon nanotube layer by CVD or physical vapor deposition (PVD), such as sputtering.

The carbon nanotube layer can include at least one carbon nanotube film, at least one carbon nanotube wire, or a combination thereof. In one embodiment, the carbon nanotube layer can include a single carbon nanotube film or two or more stacked carbon nanotube films. Thus, the thickness of the carbon nanotube layer can be controlled by the number of the stacked carbon nanotube films. The number of the stacked carbon nanotube films can be in a range from about 2 to about 100, for example, about 10, 30, or 50. In one embodiment, the carbon nanotube layer can include a layer of parallel and spaced carbon nanotube wires. The carbon nanotube layer can also include a plurality of carbon nanotube wires crossed or weaved together to form a carbon nanotube net. The distance between two adjacent parallel and spaced carbon nanotube wires can be in a range from about 0.1 μm to about 200 μm. In one embodiment, the distance between two adjacent parallel and spaced carbon nanotube wires can be in a range from about 10 μm to about 100 μm. The size of the apertures can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

Figure 4:
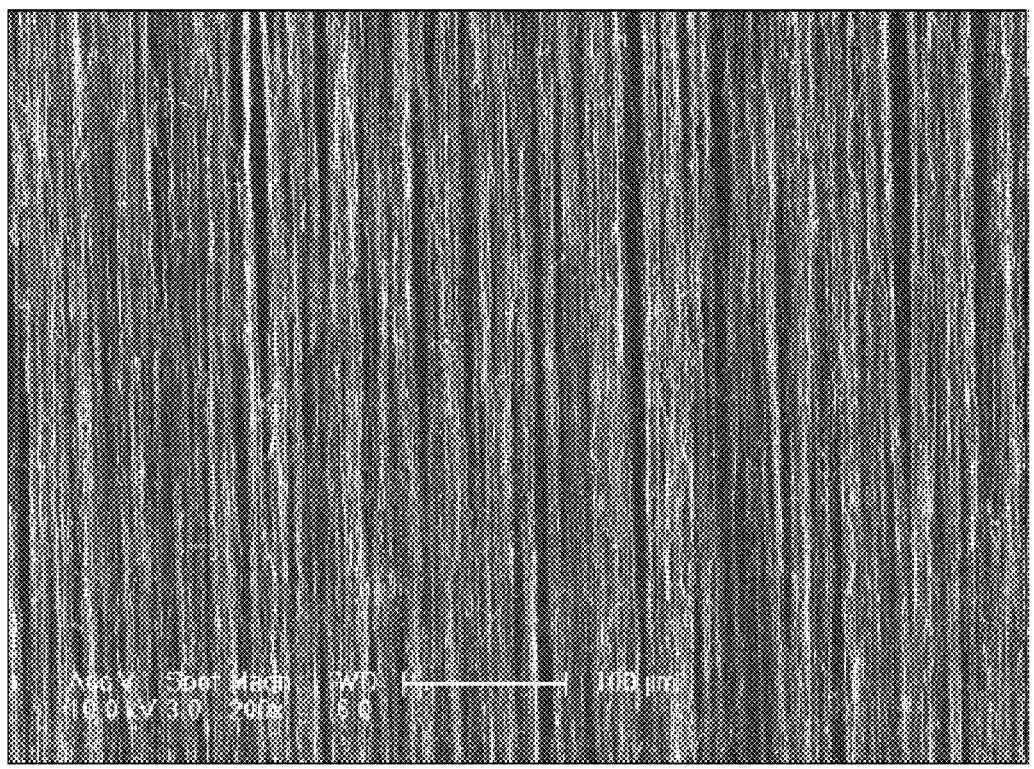
FIG. 4 shows a Scanning Electron Microscope (SEM) image of carbon nanotube film.

In one embodiment, the carbon nanotube layer includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIG. 4, each drawn carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. Some variations can occur in the drawn carbon nanotube film. The carbon nanotubes in the drawn carbon nanotube film are oriented along a preferred orientation. The drawn carbon nanotube film can be treated with an organic solvent to increase the mechanical strength and toughness, and reduce the coefficient of friction of the drawn carbon nanotube film. A thickness of the drawn carbon nanotube film can range from about 0.5 nm to about 100 μm.

Figure 5:
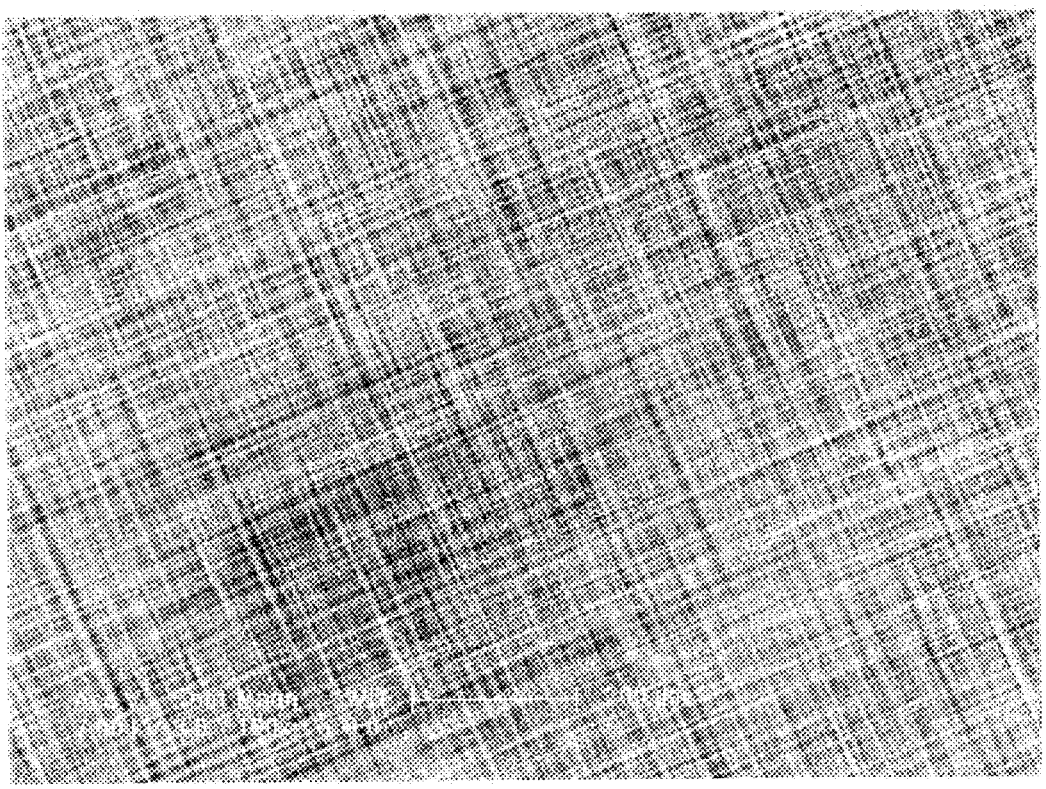
FIG. 5 shows a SEM image of a stacked carbon nanotube film structure.

Referring to FIG. 5, the carbon nanotube layer can include at least two stacked drawn carbon nanotube films. In other embodiments, the carbon nanotube layer can include two or more coplanar carbon nanotube films, and each coplanar carbon nanotube film can include multiple layers. Additionally, if the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films are combined by the van der Waals attractive force therebetween. An angle between the aligned directions of the carbon nanotubes in two adjacent carbon nanotube films can range from about 0 degrees to about 90 degrees. If the angle between the aligned directions of the carbon nanotubes in adjacent stacked drawn carbon nanotube films is larger than 0 degrees, a plurality of micropores is defined by the carbon nanotube layer. In one embodiment, the carbon nanotube layer shown with the angle between the aligned directions of the carbon nanotubes in adjacent stacked drawn carbon nanotube films is 90 degrees. Stacking the carbon nanotube films will also add to the structural integrity of the carbon nanotube layer.

Figure 6:
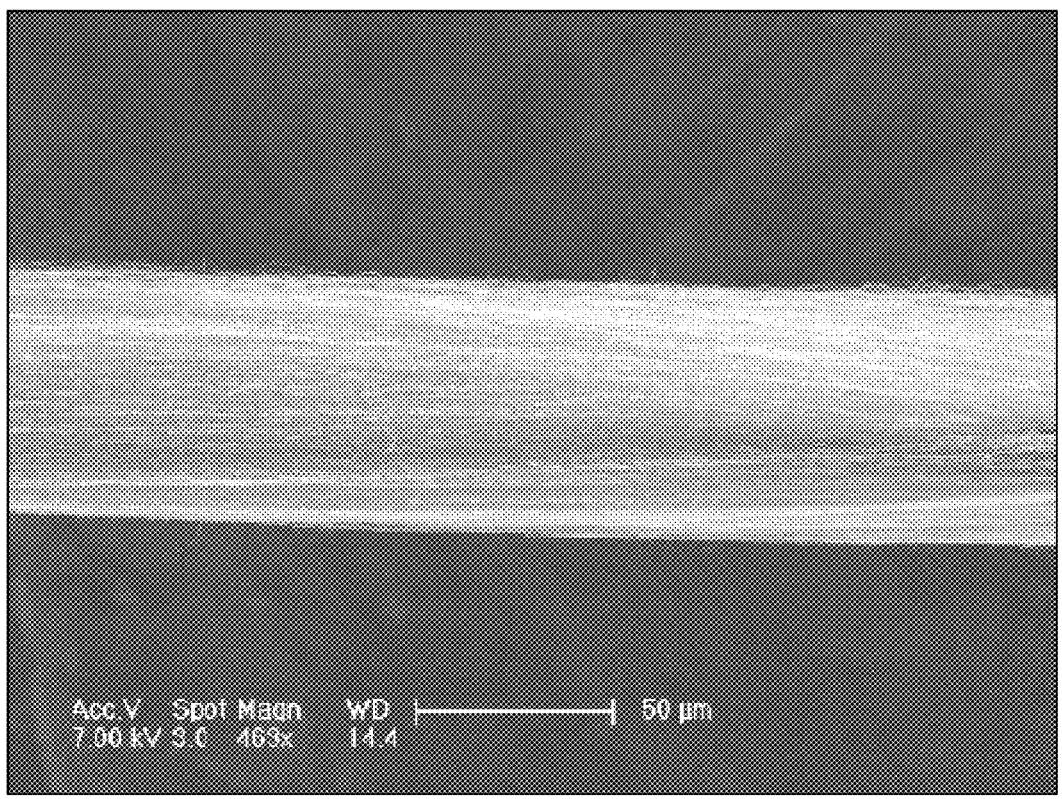
FIG. 6 shows a SEM image of untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes. Thus, the drawn carbon nanotube film will be shrunk into untwisted carbon nanotube wire. Referring to FIG. 6, the untwisted carbon nanotube wire includes a plurality of carbon nanotubes substantially oriented along a same direction (i.e., a direction along the length of the untwisted carbon nanotube wire). The carbon nanotubes are parallel to the axis of the untwisted carbon nanotube wire. Specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. Length of the untwisted carbon nanotube wire can be arbitrarily set as desired. A diameter of the untwisted carbon nanotube wire ranges from about 0.5 nm to about 100 μm.

Figure 7:
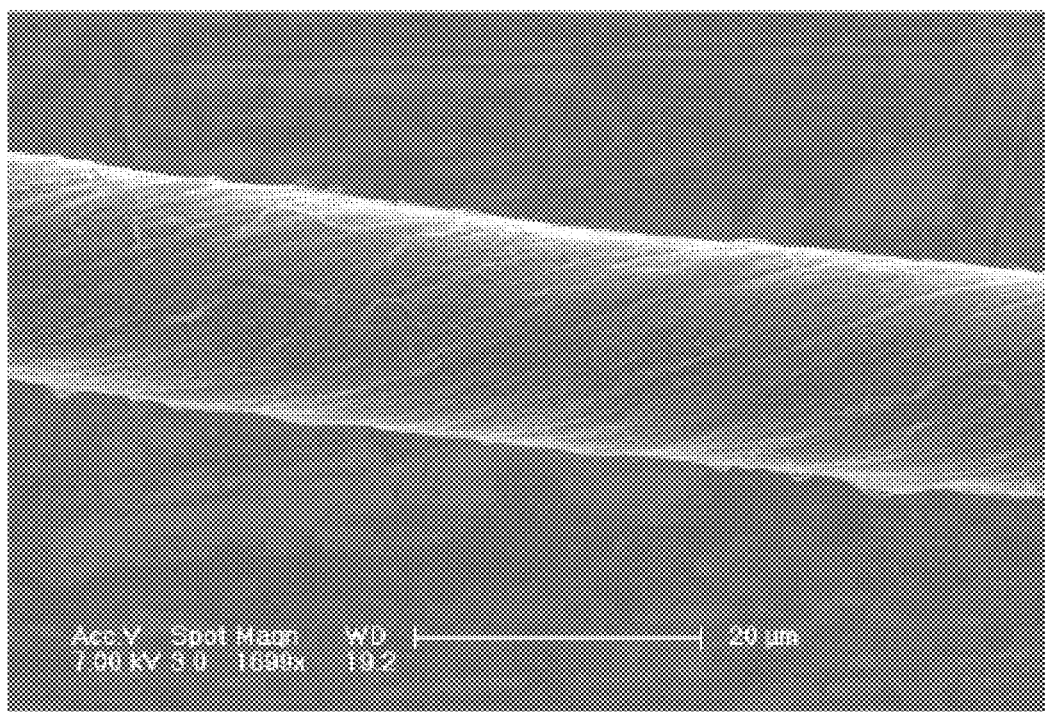
FIG. 7 shows a SEM image of twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 7, the twisted carbon nanotube wire includes a plurality of carbon nanotubes helically oriented around an axial direction of the twisted carbon nanotube wire. Specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. Length of the carbon nanotube wire can be set as desired. A diameter of the twisted carbon nanotube wire can be from about 0.5 nm to about 100 μm. Further, the twisted carbon nanotube wire can be treated with a volatile organic solvent after being twisted. After being soaked by the organic solvent, the adjacent paralleled carbon nanotubes in the twisted carbon nanotube wire will bundle together, due to the surface tension of the organic solvent when the organic solvent volatilizes. The specific surface area of the twisted carbon nanotube wire will decrease, while the density and strength of the twisted carbon nanotube wire will be increased.

The material of the insulating layer 104 can be a rigid material such as aluminum oxide ($Al_2O_3$), silicon nitride ($Si_3N_4$), silicon dioxide ($SiO_2$), or a flexible material such as polyethylene terephthalate (PET), benzocyclobutenes (BCB), polyester or acrylic resins. A thickness of the insulating layer 104 can be in a range from about 10 nanometers to about 100 micrometers. In one embodiment, the material of the insulating layer 104 is $Al_2O_3$.

The material of the gate electrode 105 can be selected from the group consisting of metal, metal alloy, indium tin oxide (ITO), antimony tin oxide (ATO), silver paste, conductive polymer, or metallic carbon nanotubes. The metal or metal alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metals. In one embodiment, the material of the gate electrode 105 is Mo, and the thickness of the gate electrode 105 is about 40 nanometers.

The insulating substrate 110 supports the thin film transistor 10. The material of the insulating substrate 110 can be the same as a substrate of a printed circuit board (PCB), and can be rigid materials (e.g., p-type or n-type silicon, silicon with an silicon dioxide layer formed thereon, crystal, crystal with a oxide layer formed thereon), or flexible materials (e.g., plastic or resin). In one embodiment, the material of the insulating substrate is glass. The shape and size of the insulating substrate 110 is arbitrary. The plurality of thin film transistors 10 can be located on the insulating substrate 110 in a predetermined order.

In use, the source electrode 151 is grounded. A voltage Vds is applied to the drain electrode 103. Another voltage Vg is applied on the gate electrode 105. The voltage Vg forms an electric field in the channel 106 of the semiconducting layer 101. Accordingly, carriers will exist in the channel near the gate electrode 105. As the Vg increases, a current is generated and flows through the channel 106. Thus, the source electrode 102 and the drain electrode 103 are electrically connected. Furthermore, because the semiconductor fragments 1010 in the semiconductor layer 101 have few semiconductor molecular layers, the semiconductor layer 101 can be easily modulated by the gate electrode 105, and the thin film transistor 10 can have better on/off ratio.

Figure 8:
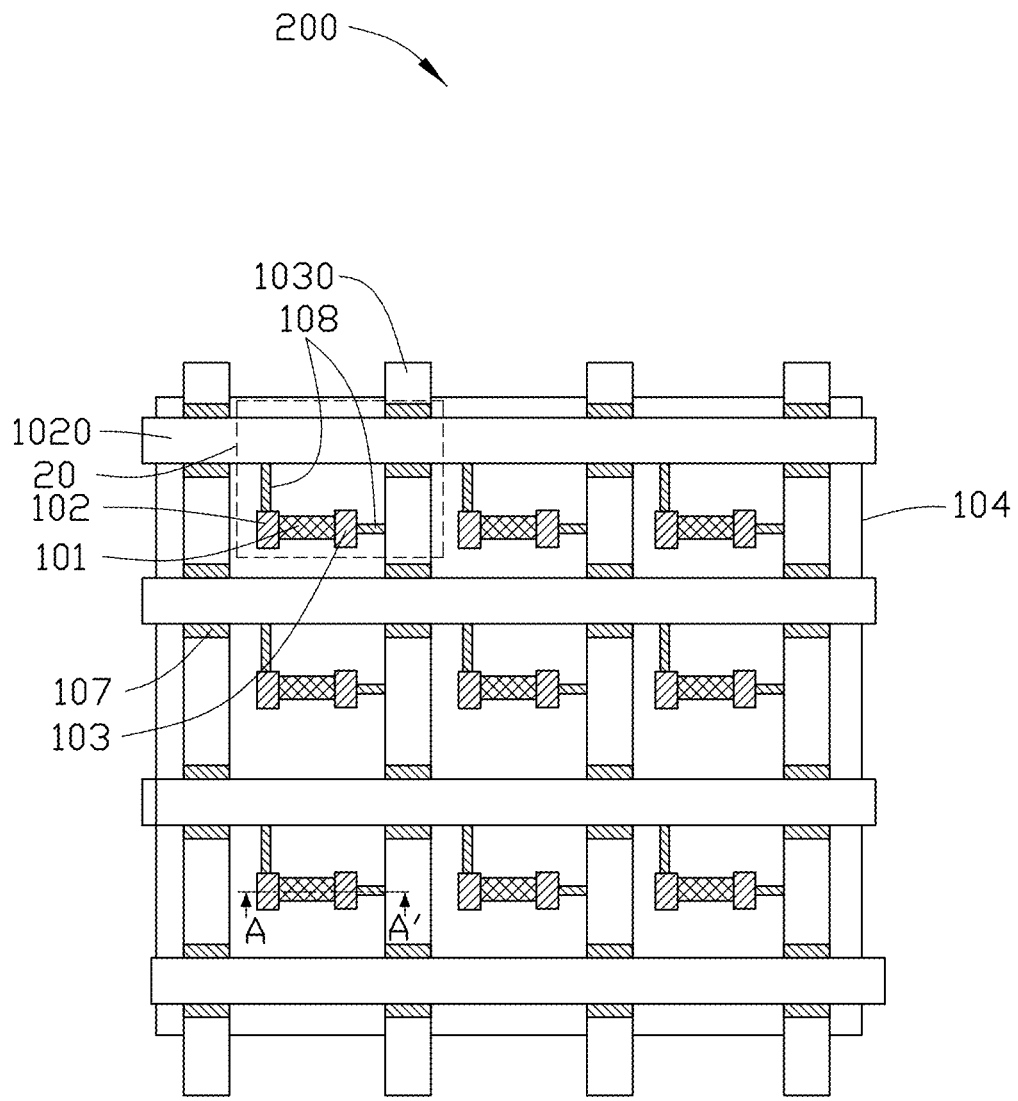
FIG. 8 is a top view of one embodiment of a thin film transistor array.
Figure 9:
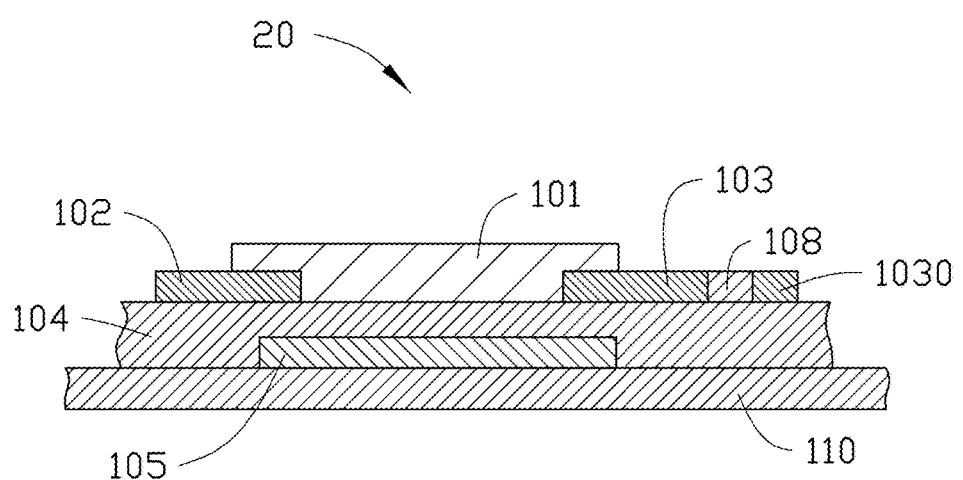
FIG. 9 shows a cross section view of the thin film transistor array of FIG. 8 along a line A-A'.

Referring to FIG. 8 and FIG. 9, one embodiment of a thin film transistor array 200 comprises a plurality of thin film transistors 20. Each of the plurality of thin film transistors 20 comprises a semiconductor layer 101, a source electrode 102, a drain electrode 103, an insulating layer 104, and a gate electrode 105. The structure of thin film transistor 20 is similar to the structure of thin film transistor 10. The plurality of thin film transistors 20 can be located on an insulating substrate 110.

The plurality of thin film transistors 20 are aligned along a plurality of columns and a plurality of rows. Furthermore, the thin film transistor array 200 comprises a plurality of row electrodes 1020 and a plurality of column electrodes 1030. The plurality of row electrodes 1020 are spaced from each other, and the plurality of column electrodes 1030 are also spaced from each other. The plurality of row electrodes 1020 are insulated from and intersect with the plurality of column electrodes 1030. The plurality of row electrodes 1020 can insulated from the plurality of column electrodes 1030 through an insulating structure 107. The plurality of row electrodes 1020 and the plurality of column electrodes 1030 can be electrically connected to the source electrode 102 and the drain electrode 103 via a plurality of electrode leads 108 respectively. The adjacent two row electrodes 1020 intersect with the adjacent two column electrodes 1030 to form a grid. The thin film transistor 20 is received into the grid. The thin film transistor 20 is electrically connected between the row electrode 1020 and the column electrode 1030. Thus the plurality of thin film transistors 20 form an array with a plurality of rows and columns.

In one embodiment, the plurality of row electrodes 1020 and the plurality of column electrodes 1030 are perpendicular with each other.

Figure 10:
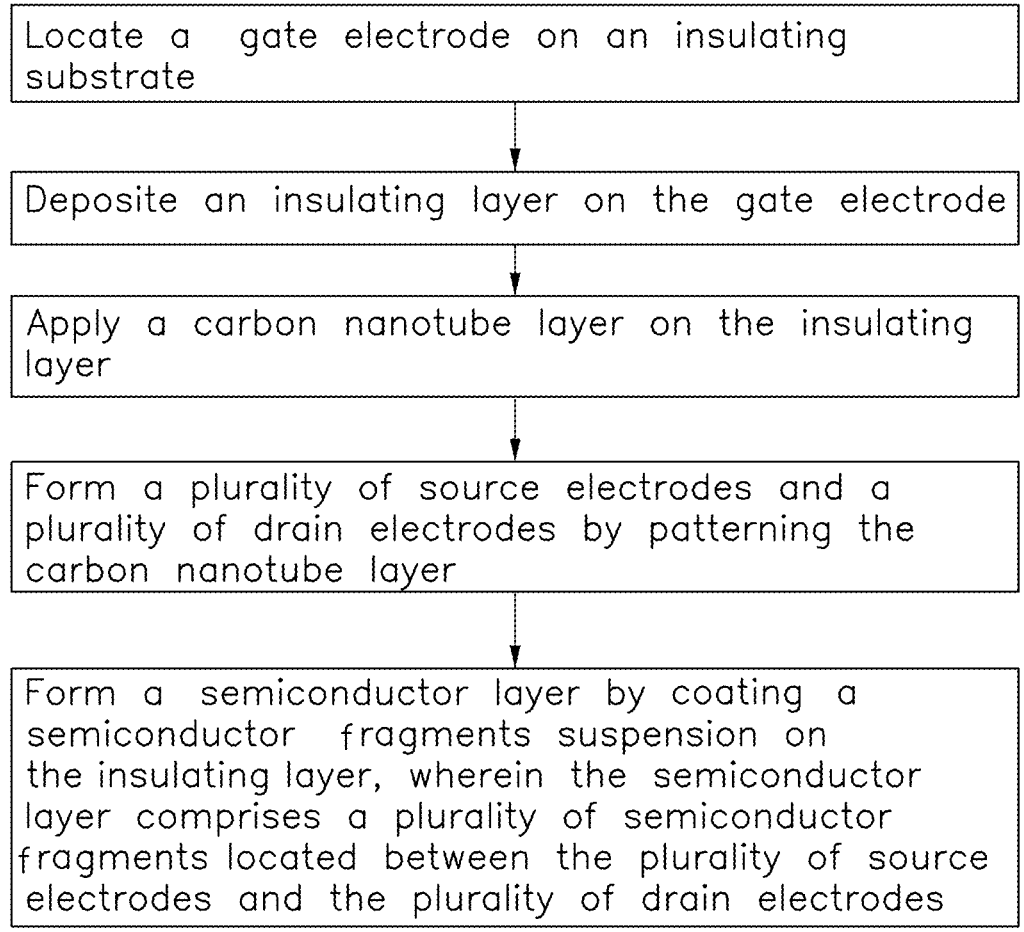
FIG. 10 shows a flow chart of one embodiment of a method of making thin film transistor array.

Referring to FIG. 10, one embodiment of a method of making thin film transistor array 200 comprises:

(S10), locating a gate electrode 105 on a surface of an insulating substrate 110;

(S20), depositing an insulating layer 104 on the insulating substrate 110 and covers the gate electrode 105;

(S30), applying a carbon nanotube layer on the insulating layer 104;

(S40), forming a plurality of source electrodes 102 and a plurality of drain electrodes 103 by patterning the carbon nanotube layer; and (S50), forming a semiconductor layer 101 on the insulating layer 104 by coating a semiconductor fragments suspension on the insulating layer 104, wherein the semiconductor layer 101 comprises a plurality of semiconductor fragments located between the plurality of source electrodes 102 and the plurality of drain electrodes 103.

In step (S10), the gate electrode 105 can be formed via screen printing method, magnetron sputtering method, vapor deposition, or atomic layer deposition method. The gate electrode 105 can be a continuous layered structure. Furthermore, the insulating substrate 110 can comprise the plurality of gate electrodes 105 spaced from each other. The plurality of gate electrodes 105 can be formed through a pattern mask layer or etching method. In one embodiment, the plurality of gate electrodes 105 are formed by etching a conductive film. In another embodiment, the plurality of gate electrodes 105 can also be formed by vapor deposition.

In step (S20), the insulating layer 104 can be formed by magnetron sputtering method, vapor deposition method, or an atomic layer deposition method. In one embodiment, the insulating layer 104 is formed by depositing alumina layer by atomic layer deposition method, and the thickness of the insulating layer 104 is about 100 nanometers.

In step (S30), the carbon nanotube layer comprises a plurality of carbon nanotubes. The carbon nanotube layer can be formed by directly locating a carbon nanotube film on the insulating layer 104. Furthermore, the carbon nanotube film can be treated via a volatile solution, thus the carbon nanotube film can be tightly attached on the insulating layer 104 by evaporating the volatile solution. The volatile solution can be ethanol or water. In one embodiment, the carbon nanotube film is a drawn carbon nanotube film.

In step (S40), the carbon nanotube layer can be patterned via plasma etching, laser etching, or wet etching. The source electrode 102 and the drain electrode 103 formed by patterning the carbon nanotube layer are spaced from each other. In one embodiment, the source electrode 102 and the drain electrode 103 are opposite to each other.

In step (S50), the semiconductor layer 101 can be formed by:

(S51), providing a semiconductor material;

(S52), forming a semiconductor fragments suspension by mixing and ultrasonicating the semiconductor material with a polar solvent, wherein each of the semiconductor fragments suspension comprises a plurality of semiconductor fragments, each of the plurality of semiconductor fragments comprises a plurality of semiconductor molecular layers, and the quantity of the plurality of semiconductor layers range from about 1 to 20; and (S53), spin coating the semiconductor fragments suspension on the insulating layer 104.

In step (S51), the semiconductor material is a layered structure comprising over hundreds of molecular layers. The semiconductor material can be a transition metal compound, or combinations thereof, such as $MoS_2$, WS2, BN, $MnO_2$, ZnO, $MoSe_2$, $MoTe_2$, $TaSe_2$, $NiTe_2$, or $Bi_2Te$. In one embodiment, the semiconductor material is $MoS_2$.

In step (S52), the semiconductor material is ultrasonicated in the polar solvent with an ultrasonic device to obtain the plurality of semiconductor fragments with several semiconductor molecular layers. Under the action of ultrasonic waves, the micro-bubbles maintain vibration in the polar solvent. While the sound intensity reaches a certain level, the micro-bubbles rapidly expand, and then quickly closed. In this process, shock wave is instantaneously generated, and apply great pressure around the micro-bubbles. The adjacent molecular layers in the semiconductor material are separated under the repeated action of the shock wave. Thus the semiconductor fragments with a few number of molecular layers is obtained.

The polar solvent means a solvent containing a hydroxyl group or a carbonyl group, or other polar groups. The polar solvent has strong polarity, large dielectric constant, such as water, ethanol, N-methylpyrrolidone (NMP), acetone, chloroform, or tetrahydrofuran. In one embodiment, the polar solvent has low-boiling point. In the polar solvent, the attractive force between adjacent semiconductor molecular layer will be decreased under the action of the polar group. Thus the semiconductor molecular layer can be easier to be separated.

A mixed ratio between the semiconductor material and the polar solvent can be 1 g/100 mL, 1 g/50 mL, 1 g/30 mL, 1 g/20 mL, or 1 g/10 mL, and can be selected according to need.

The ultrasonic power can range from about 300 watts to about 600 watts. The ultrasonic time can range from about 5 hours to about 24 hours. In one embodiment, the mixing ratio of the semiconductor material and the polar solvent is 1 g/30 mL, the polar solvent is NMP, the ultrasonic power is about 300 watts, and the ultrasonic time is about 8 hours.

Furthermore, the semiconductor fragments suspension can be treated via centrifugation filtration to remove the semiconductor fragments with a large number of molecular layers. The semiconductor fragments with few molecular layers will be suspended in the middle and upper suspension.

In step (S53), the semiconductor layer 101 can be coated on the insulating layer 104 via a mask layer (not shown) with a plurality of through holes. The semiconductor layer 101 is located between the source electrode 102 and the drain electrode 103. Furthermore, the semiconductor layer 101 covers a portion of the source electrode 102 and the drain electrode 103. The semiconductor layer 101 comprises at least one semiconductor fragment. While the semiconductor layer 101 comprises a plurality of semiconductor fragments, the plurality of semiconductor fragments can be joined end to end and electrically connected with each other to form conductive path. The spinning speed can range from 800 rpm to about 1500 rpm (round per minute). The spinning time can range from about 30 seconds to about 10 minutes. In one embodiment, the spinning speed is 800 rpm, and spinning time is about 30 seconds.

Furthermore, the spinning coating method can form a plurality of semiconductor layer 101 spaced from each other on the insulating layer 104 at the same time. The volatile solvent can be easily evaporated during spinning process, thus the semiconductor fragments can be tightly and uniformly formed on the insulating layer.

Furthermore, a plurality of row electrodes 1020 and a plurality of column electrodes 1030 can be applied on the insulating layer 104. The plurality of row electrodes 1020 are electrically connected to the plurality of source electrodes 102, and the plurality of column electrodes 1030 are electrically connected to the plurality of drain electrodes 103. The plurality of row electrodes 1020 and the plurality of column electrodes 1030 can be insulated from each other via an insulating structure 107.

The method of making thin film transistor array has following advantages. The semiconductor segments can be formed by ultrasonic and directly coated on the insulating layer as the semiconductor layer. The method is easy. Furthermore, the plurality of source electrodes and the plurality of drain electrodes is formed by directly applying the carbon nanotube layer and patterning the carbon nanotube layer. Thus it is easier for industrialization.

Depending on the embodiments, certain of the steps described may be removed, others may be added, and the sequence of steps may be altered. It is also to be understood that the description and the claims drawn to a method may comprise some indication in reference to certain steps. However, any indication used is only to be viewed for identification purposes and not as a suggestion as to an order for the steps.

It is to be understood, however, that even though numerous characteristics and advantages of the present embodiments have been set forth in the foregoing description, together with details of the structures and functions of the embodiments, the disclosure is illustrative only, and changes may be made in detail, especially in the matters of shape, size, and arrangement of parts within the principles of the disclosure.

What is claimed is:

1. A method for making thin film transistor array, the method comprising:
   forming a gate electrode on a surface of an insulating substrate;
   depositing an insulating layer on the insulating substrate to cover the gate electrode;
   applying a carbon nanotube layer on the insulating layer;
   forming a plurality of source electrodes and a plurality of drain electrodes, opposite to each other, by patterning the carbon nanotube layer;
   applying a semiconductor layer by coating a semiconductor fragment suspension on the insulating layer, wherein the semiconductor layer comprises a plurality of semiconductor fragments located between the plurality of source electrodes and the plurality of drain electrodes;
   wherein the semiconductor fragment suspension is coated on the insulating layer by:
   providing a semiconductor material;
   forming the semiconductor fragments suspension by ultrasonic mixing the semiconductor material with a polar solvent, wherein the semiconductor fragments suspension comprises the plurality of semiconductor fragments, each of the plurality of semiconductor fragments comprises a plurality of semiconductor molecular layers stacked together, and a number of the plurality of semiconductor layers ranges from about 1 to about 20; and
   spin coating the semiconductor fragments suspension on the insulating layer.

2. The method of claim 1, wherein the plurality of semiconductor fragments are electrically connected to each other to form a plurality of conductive paths between the plurality of source electrodes and the plurality of drain electrodes.

3. The method of claim 2, wherein the plurality of semiconductor fragments are joined end to end along a direction from the plurality of source electrodes to the plurality of drain electrodes.

4. The method of claim 2, wherein each adjacent two of the plurality of semiconductor fragments are partially overlapped with each other.

5. The method of claim 1, wherein the semiconductor material is a layered structure with more than 100 molecular layers, and the semiconductor material is separated into the plurality of semiconductor fragments in the polar solvent during ultrasonic mixing the semiconductor material.

6. The method of claim 5, wherein a plurality of microbubbles are formed in the polar solvent.

7. The method of claim 5, wherein the polar solvent is selected from the group consisting of water, ethanol, N-methylpyrrolidone, acetone, chloroform, and tetrahydrofuran.

8. The method of claim 5, wherein a mixed ratio between the semiconductor material and the polar solvent ranges from 1 g/100 mL to 1 g/10 mL.

9. The method of claim 5, wherein the semiconductor material and the polar solvent are sonicated with an ultrasonic device, and an ultrasonic power of the ultrasonic device ranges from about 300 watts to about 600 watts, and an ultrasonic time ranges from about 5 hours to about 24 hours.

10. The method of claim 5, wherein a spinning speed ranges from 800 rpm to about 1500 rpm, and a spinning time ranges from about 20 seconds to about 10 minutes.

11. The method of claim 5, further comprising a step of treating the semiconductor fragments suspension via centrifugation filtration.

12. The method of claim 1, wherein the semiconductor layer consists of the plurality of semiconductor fragments.

13. The method of claim 1, wherein the carbon nanotube layer is patterned via plasma etching, laser etching, or wet etching.

14. The method of claim 1, wherein a ratio between a size and a thickness of each of the plurality of semiconductor fragments range from about $3 \times 10^5$ nanometer to about $4 \times 10^5$ nanometer.

15. The method of claim 1, wherein a material of the semiconductor layer is selected from the group consisting of $MoS_2$, $WS_2$, $BN$, $MnO_2$, $ZnO$, $MoSe_2$, $MoTe_2$, $TaSe_2$, $NiTe_2$, and $Bi_2Te_3$.

16. The method of claim 1, further comprising:
forming a plurality of row electrodes, electrically connected to the plurality of source electrodes; and
applying a plurality of column electrodes, electrically connected to the plurality of drain electrodes.

* * * * *